United States Patent
Bruckman et al.

(10) Patent No.: US 6,957,369 B2
(45) Date of Patent: Oct. 18, 2005

(54) HIDDEN FAILURE DETECTION

(75) Inventors: Leon Bruckman, Petah Tikva (IL); Shmuel Ilan, Ramat-Gan (IL)

(73) Assignee: Corrigent Systems Ltd., Tel Aviv (IL)

( * ) Notice: Subject to any disclaimer, the term of this patent is extended or adjusted under 35 U.S.C. 154(b) by 415 days.

(21) Appl. No.: 10/156,851

(22) Filed: May 30, 2002

(65) Prior Publication Data

US 2003/0226072 A1 Dec. 4, 2003

(51) Int. Cl.$^7$ .............................................. G01R 31/28
(52) U.S. Cl. ...................................................... 714/716
(58) Field of Search ................................ 714/724, 726, 714/727, 712, 715, 716, 717; 370/249

(56) References Cited

U.S. PATENT DOCUMENTS

| | | |
|---|---|---|
| 5,132,635 A | 7/1992 | Kennedy |
| 5,327,435 A | 7/1994 | Warchol |
| 5,420,985 A | 5/1995 | Cantrell et al. |
| 5,541,862 A * | 7/1996 | Bright et al. ............... 702/122 |
| 5,574,730 A | 11/1996 | End, III et al. |
| 5,627,842 A | 5/1997 | Brown et al. |
| 5,841,788 A | 11/1998 | Ke |
| 6,028,845 A * | 2/2000 | Serikawa et al. ........... 370/249 |
| 6,122,756 A | 9/2000 | Baxter et al. |
| 6,233,073 B1 * | 5/2001 | Bowers et al. |
| 6,366,556 B1 * | 4/2002 | Ballintine et al. |
| 6,456,587 B2 * | 9/2002 | Taniguchi |

FOREIGN PATENT DOCUMENTS

WO    WO 01/93499    12/2001

* cited by examiner

*Primary Examiner*—Albert Decady
*Assistant Examiner*—James C Kerveros
(74) *Attorney, Agent, or Firm*—Oblon, Spivak, McClelland, Maier & Neustadt, P.C.

(57) ABSTRACT

A method for self-testing of an electronic system that includes a main module and subsidiary modules, which are connected to the main module by data lines, at least some of which may be idle. One of the idle lines is selected to serve as an aid line, and the subsidiary module to which the aid line is connected is instructed to loop back traffic reaching the subsidiary module via the aid line. Another idle line is selected for testing, and a switch in the main module is configured to link the aid line and the line under test. The subsidiary module to which the line under test is connected transmits test traffic over the idle line to the main module. If the test traffic does not return to the subsidiary module within a predetermined period of time, a failure is reported.

26 Claims, 2 Drawing Sheets

HIDDEN FAILURE DETECTION

FIELD OF THE INVENTION

The present invention relates generally to diagnostic testing of electronic equipment, and specifically to non-intrusive self-testing of communication systems.

BACKGROUND OF THE INVENTION

Electronic equipment may fail not only during operation, but also when it is idle between operational periods. Failures of idle components are referred to as "hidden failures," because they do not affect service at the moment they occur and thus may go undetected. From the operator's point of view, hidden failures are a particularly troublesome problem, since they may remain undetected until the idle component is activated. In other words, the failure becomes apparent just when the component is actually needed. It is therefore desirable to detect hidden failures while components are idle, so that the failed components can be replaced before they are needed, without interrupting service. Ideally, the idle components should be tested non-intrusively, i.e., without interrupting normal operation of active components.

Backplane-based configurations are commonly used in communication and computing equipment. In network access systems, for example, a backplane may be used to connect a main module, having a trunk link to a core network, to a number of subsidiary modules, such as line cards, with ports serving network users. The main module typically includes a switch for multiplexing among the subsidiary modules. Traces on the backplane connect the subsidiary modules to the ports of the switch. Typically, the main module and subsidiary modules contain embedded processors which are used, inter alia, for self-test and other diagnostic functions.

Various methods are known in the art for self-testing of backplane-based communication equipment. For example, PCT Publication WO 01/93499, whose disclosure is incorporated herein by reference, describes an ATM switch/multiplexer system with non-intrusive self-test capability. A bus couples an ATM layer device (the switch) to a number of physical layer devices. A dedicated self-test circuit also couples to the bus. This circuit is adapted to loop back cells from the ATM layer device in a self-test function through a dedicated virtual circuit.

As another example, U.S. Pat. No. 5,841,788, whose disclosure is incorporated herein by reference, describes methods for backplane interconnect testing. Test vectors are applied to individual circuit boards in a system while the remaining circuit boards are disabled. Backplane faults are identified by comparing observed receiver signals to the signals expected in response to the test vectors.

SUMMARY OF THE INVENTION

It is an object of some aspects of the present invention to provide improved methods and systems for non-intrusive testing of electronic systems, particularly multi-board, backplane-based systems.

In preferred embodiments of the present invention, an electronic system comprises a master module and multiple subsidiary modules, each of which is connected to the master module by one or more connection lines. Typically, though not necessarily, the master and subsidiary modules plug into a backplane, and the lines comprise printed circuit traces on the backplane. The master module comprises a switch, which is typically used for linking the subsidiary modules via the connection lines to a network trunk. At any given time, a number of the connection lines are likely to be idle.

In order to test the idle lines and the circuitry associated with them, the master module selects one of the idle lines to serve as an aid line. It instructs the subsidiary module to which the aid line is connected to loop back all traffic that reaches it via the aid trace. This loopback function does not require that the subsidiary module decode or process the traffic—only that it send it back bit by bit to over the aid line to the master module. The master module then selects another one of the idle lines to be tested, and configures the switch so that it connects the line selected for testing to the aid line. The master module instructs the subsidiary module to which the tested line is connected to transmit test traffic over the tested line. If all the components and connections are working properly, the test traffic is conveyed by the switch to the aid line, and then looped back over the same route to the module that sent the traffic. If the traffic returns intact to the sending module, it is a sign that the traces and components are in order. If the traffic is corrupted or fails to return to the sending module, a fault is reported. The master module preferably continues in this manner to test all the lines in the system that are idle at any given time.

The present invention thus enables an electronic system to test its idle lines and components and detect hidden failures without intruding on normal traffic carried by the system's active lines. The testing method makes use of existing components in the system and requires substantially no dedicated testing hardware. It is applicable to all types of subsidiary modules, even in systems that mix different modules using different data formats and communication protocols. Although preferred embodiments are described herein with particular reference to communication systems, the principles of the present invention may likewise be applied in other types of modular systems, particularly backplane-based systems.

There is therefore provided, in accordance with a preferred embodiment of the present invention, a method for self-testing of an electronic system that includes a main module and at least first and second subsidiary modules, each such module connected to the main module by one or more lines for carrying data, at least some of which lines may be idle, the main module including a switch having ports connected to the lines, the method including:

selecting a first idle line among the idle lines connecting the first subsidiary module to a first port of the switch on the main module to serve as an aid line;

instructing the first subsidiary module to loop back traffic reaching the first subsidiary module via the aid line;

selecting for testing a second idle line among the idle lines connecting the second subsidiary module to a second port of the switch on the main module;

configuring the switch to link the first and second ports;

transmitting test traffic over the second idle line from the second subsidiary module to the main module; and reporting that a failure has occurred if the test traffic does not return to the second subsidiary module within a predetermined period of time.

Preferably, instructing the first subsidiary module includes configuring the first subsidiary module to loop back the traffic to the main module substantially without processing the data included in the test traffic. The first and second subsidiary modules may be configured to transmit and receive the data in different, respective first and second formats, such that the test traffic transmitted from the second subsidiary module and looped back by the first subsidiary module is in the second format.

Preferably, the method further includes selecting one or more further idle lines for testing among the idle lines in the system, wherein the further idle lines connect to further ports of the switch on the main module, and repeating the steps of configuring the switch, transmitting the test traffic and reporting that the failure has occurred with respect to the further idle lines until all the idle lines have been tested.

Typically, the main module and subsidiary modules include cards, which are plugged into a backplane, and the lines include traces on the backplane. In a preferred embodiment, the switch is configured to connect the lines to a network communication trunk, and the traffic includes communication traffic. Preferably, transmitting the test traffic includes testing the second idle line while continuing to use the lines that are not idle for carrying the data to the network communication trunk.

There is also provided, in accordance with a preferred embodiment of the present invention, a method for self-testing of an electronic system that includes a main module and multiple subsidiary modules, each such module being connected to the main module by one or more lines for carrying data, the method including:

selecting first and second subsidiary modules of different types for testing among the multiple subsidiary modules, the first and second subsidiary modules being configured to transmit and receive the data in different, respective first and second formats;

instructing the first subsidiary module to loop back traffic reaching the first subsidiary module from the main module;

configuring the main module to connect the first and second subsidiary modules, so that the traffic transmitted by the second subsidiary module is conveyed to the first subsidiary module via the main module and is then looped back via the main module to the second subsidiary module; and testing the system by causing the second subsidiary module to transmit test traffic in the second format to the main module, and assessing whether the test traffic is returned intact from the first module.

Typically, the traffic includes communication traffic, and the first and second formats are determined respectively by different first and second communication protocols. In a preferred embodiment, one of the first and second protocols is a time domain multiplexing (TDM) protocol, while the other of the first and second protocols is a packet data protocol.

There is additionally provided, in accordance with a preferred embodiment of the present invention, modular electronic apparatus, including:

a backplane, which includes traces for carrying data between modules that are plugged into the backplane;

a main module, adapted to be plugged into the backplane, the main module including a switch having ports for connection to the traces of the backplane;

at least first and second subsidiary modules, adapted to be plugged into the backplane so as to be connected to the main module by the traces, at least some of which traces may be idle; and a system control processor, which is adapted to select a first idle trace among the idle traces connecting the first subsidiary module to a first port of the switch on the main module to serve as an aid trace, to instruct the first subsidiary module to loop back traffic reaching the first subsidiary module via the aid trace, to select for testing a second idle trace among the idle traces connecting the second subsidiary module to a second port of the switch on the main module, and to configure the switch to link the first and second ports, the system control processor being further adapted to cause test traffic to be transmitted over the second idle trace from the second subsidiary module to the main module, and to report that a failure has occurred if the test traffic does not return to the second subsidiary module within a predetermined period of time.

There is further provided, in accordance with a preferred embodiment of the present invention, modular electronic apparatus, including:

a backplane, which includes traces for carrying data between modules that are plugged into the backplane;

a main module, adapted to be plugged into the backplane;

a plurality of subsidiary modules, adapted to be plugged into the backplane so as to be connected to the main module by the traces; and a system control processor, which is adapted to select first and second subsidiary modules of different types for testing among the multiple subsidiary modules, the first and second subsidiary modules being configured to transmit and receive the data in different, respective first and second formats, and which is further adapted to test the modules by causing the first subsidiary module to loop back traffic reaching the first subsidiary module from the main module, by configuring the main module to connect the first and second subsidiary modules, so that, the traffic transmitted by the second subsidiary module is conveyed to the first subsidiary module via the main module and is then looped back via the main module to the second subsidiary module, and by causing the second subsidiary module to transmit test traffic in the second format to the main module, and assessing whether the test traffic is returned intact from the first module.

The present invention will be more fully understood from the following detailed description of the preferred embodiments thereof, taken together with the drawings in which:

DETAILED DESCRIPTION OF PREFERRED EMBODIMENTS

Figure 1:
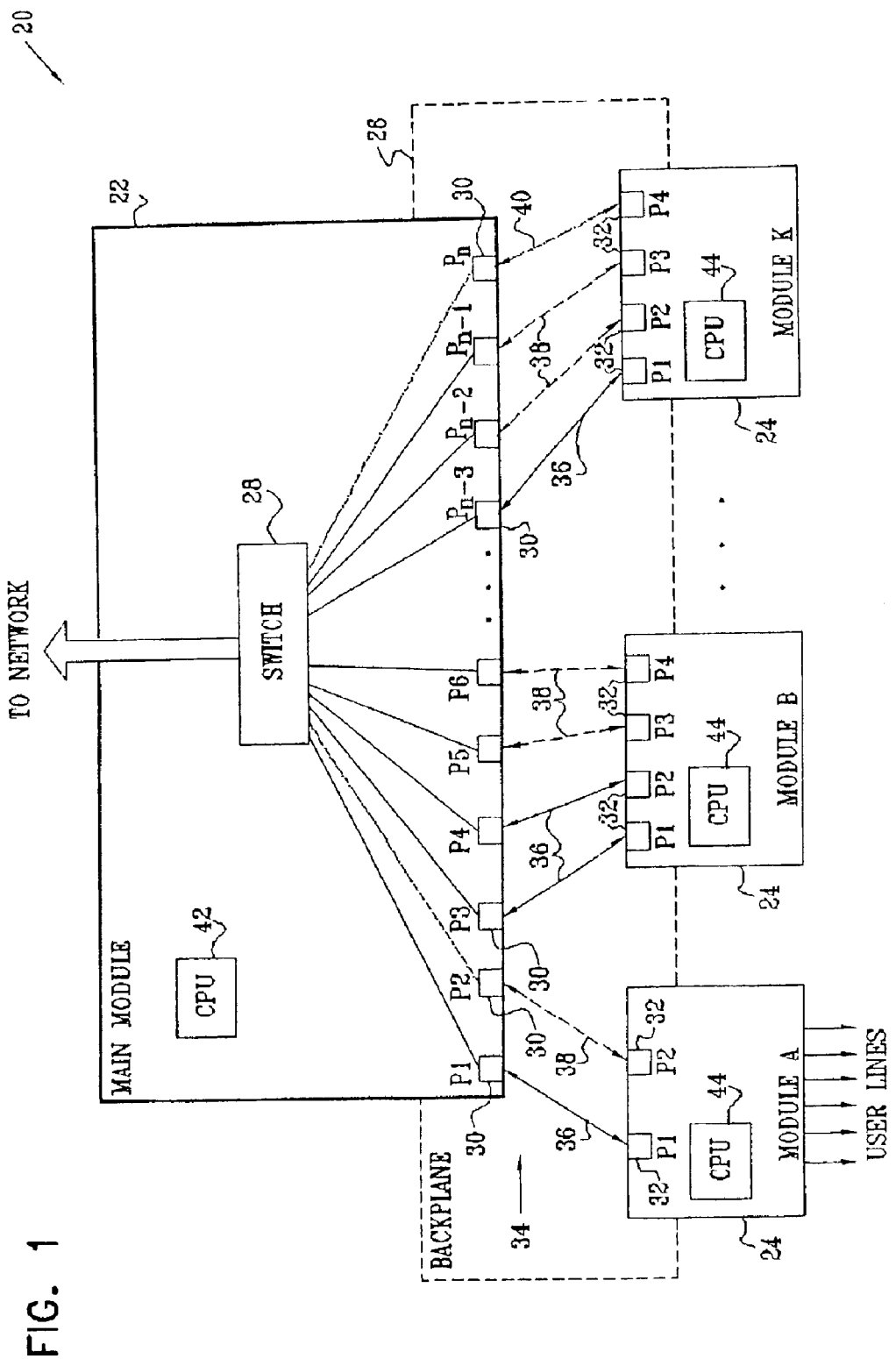
FIG. 1 is a block diagram that schematically illustrates a communication system with non-intrusive hidden failure detection capability, in accordance with a preferred embodiment of the present invention.

FIG. 1 is a block diagram that schematically illustrates a communication system 20, in accordance with a preferred embodiment of the present invention. System 20 comprises a main module 22 and a number of subsidiary modules 24, labeled module A, B, . . . , K. The main and subsidiary modules plug into a backplane 26, which includes traces 34 that connect the modules, as described below. Main module 22 comprises a switch 28 and multiple ports 30, labeled P1, P2, . . . , Pn, for connecting to ports 32 of subsidiary modules 24 via the backplane traces. Ports 30 and 32 typically comprise high-speed physical interface components. Typically, the ports comprise serializer/deserializer (SERDES) interfaces, as are known in the art, although other types of backplane interfaces may also be used.

In this embodiment, switch 28 aggregates upstream traffic from ports 30 to an uplink trunk connecting to a high-speed network. The switch likewise distributes downstream traffic from the network to ports 30 using an appropriate internal protocol. Switch 28 can also be configured to direct data from any one of main module ports 30 to any other main module port, thus forming a virtual connection between subsidiary module ports 32 that are connected to these main module ports. This cross-connection function is commonly available in off-shelf physical layer switches, such as the VCS835 Crosspoint Switch, which is produced by Vitesse Semiconductor Corporation (Camarillo, Calif.).

System 20 thus provides multiplexed network access for users who are connected to subsidiary modules 24. Different types of subsidiary modules can be connected in parallel via backplane 26 to the same main module 22, each module operating in accordance with its own communication protocol and data format. For example, module A may operate in accordance with a time domain multiplexing (TDM) protocol for voice and video services, while module B is an Ethernet board for packet data services, and so forth. The physical layer interfaces between the subsidiary modules and the main module are uniform, and the different services are thus transmitted through ports 30 and 32 and are aggregated by switch 28 irrespective of the differences in service type. Typically, an operator of system 20 installs subsidiary modules 24 with some spare capacity, to allow provisioning of additional services when requested by users. Therefore, some of traces 34 on backplane 26 may be idle at any given time. In FIG. 1, active traces 36 are shown by solid lines, and idle traces 38 are dashed.

While one of traces 38 is idle, a failure may occur in either main module port 30 or subsidiary module port 32 that is connected to the trace, or in the trace itself. Such failures may result, for example, from changes in temperature or humidity, from electrostatic discharge or from ionizing radiation. In order to detect these hidden failures while the corresponding traces are idle, one of the idle traces is selected to serve as an aid trace 40, and this trace is used in carrying out a non-intrusive test procedure, as described below. The test procedure is supervised by an embedded system control processor 42 in main module 22, in communication with subsidiary processors 44 on subsidiary modules 24 via a separate control channel (not shown) on backplane 26. Processors 42 and 44 may comprise, for example, MPC8265 and MPC8250 integrated communications processors, produced by Motorola Semiconductor Products (Austin, Tex.), and are preferably used to perform general system management functions in addition to the test procedure described here. The control channel linking the processors is typically an Ethernet channel, over which the processors communicate using a suitable management protocol, such as the well-known Simple Network Management Protocol (SNMP).

Figure 2:
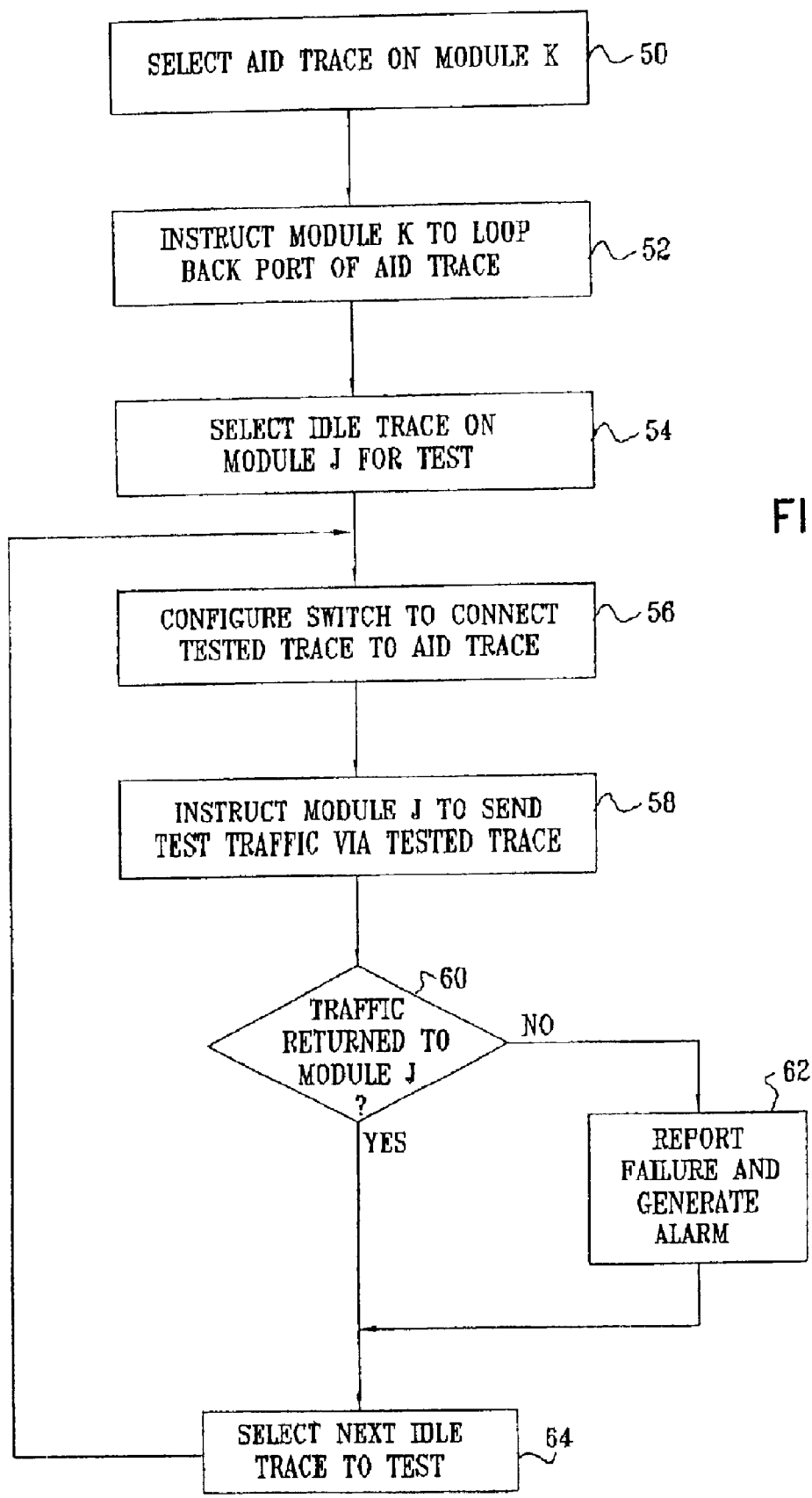
FIG. 2 is a flow chart that schematically illustrates a method for hidden failure detection, in accordance with a preferred embodiment of the present invention.

FIG. 2 is a flow chart that schematically illustrates a method for testing idle traces in system 20 in order to detect hidden defects, in accordance with a preferred embodiment of the present invention. The method may be invoked by the operator of system 20 or, additionally or alternatively, it may be invoked automatically on a predetermined schedule or when certain operating conditions occur. When processor 42 is ready to begin the test sequence, it selects one of the idle traces to serve as aid trace 40, at an aid selection step 50. In the present example, the trace connecting port Pn on main module 22 with port P4 on subsidiary module K is chosen, but this choice is arbitrary, and substantially any other idle trace could be used instead. Processor 42 then instructs processor 44 of module K to set port P4 to loop back all traffic that it receives on trace 40, at a loopback step 52. This function is performed by the backplane interface component, which simply buffers and returns the stream of data bits that it receives. As long as the loopback setting is in effect, module K makes no attempt to process the data that it receives on port P4. Therefore, it makes no difference whether or not the data are in a format that module K is able to recognize and process.

Having configured aid trace 40, processor 42 selects one of idle traces 38 to test, at a test selection step 54. Assume for now that the processor selects the trace connecting port P2 on main module 22 with port P2 on subsidiary module A. Processor 42 configures switch 28 to connect ports P2 and Pn on main module 22, at a switch configuration step 56, thereby creating a virtual connection between port P2 on subsidiary module A and port P4 on subsidiary module K. Processor 42 then instructs processor 44 of module A to transmit test traffic through port P2, at a test transmission step 58. The test traffic typically comprises test data in the data communication format used by module A, which depends on the communication protocol for which module A is configured.

As long as all traces and components are working properly, the test traffic transmitted through port P2 will be conveyed by switch 28 to port Pn of main module 22, and then via aid trace 40 to port P4 of subsidiary module K. This port will loop the test traffic back through the switch to port P2 of the main module, and from there via trace 38 to port P2 of subsidiary module A. Processor 44 on module A waits for the test traffic to be returned to port P2 for a predetermined timeout period, at a traffic return step 60. If the traffic does not return on time, processor 44 concludes that a failure has occurred, and notifies processor 42 accordingly, at a failure reporting step 62. A similar notification is sent if the traffic returns, but processor 44 on module A determines that the test data have been corrupted. When any such failure occurs, processor 42 typically sends an alarm to the operator of system 20 and may also perform additional tests to try to localize the failure.

After testing of the first idle trace 38 is completed (successfully or not), processor 42 selects the next idle trace to test, at a next trace selection step 64. For example, the trace connecting port P3 on subsidiary module B to port P5 on the main module may be chosen next. The testing process continues at step 56, cycling through the steps of FIG. 2 in this manner until all the idle traces have been tested. Processor 42 maintains a database of management information regarding subsidiary modules 24, including a list of which traces are active, and which are idle. When a trace changes state, or when a module is inserted in or removed from backplane 26, processor 42 updates the database accordingly and uses the updated database in carrying out the next cycle of testing.

Although the embodiments described above illustrate specifically the application of the present invention to communication systems, the principles of the present invention may likewise be applied in other types of modular electronic systems, particularly backplane-based systems. It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. In an electronic system that includes a main module and at least first and second subsidiary modules, each of said at least first and second subsidiary modules connected to the main module by one or more lines for carrying data, at least some of which lines are sometimes idle, the main module including a switch having ports connected to the lines, a method for self-testing the system, comprising:

selecting a first idle line among idle lines connecting the first subsidiary module to a first port of the switch on the main module to serve as an aid line;

instructing the first subsidiary module to loop back traffic reaching the first subsidiary module via the aid line;

selecting for testing a second idle line among the idle lines connecting the second subsidiary module to a second port of the switch on the main module;

configuring the switch to link the first and second ports;

transmitting test traffic over the second idle line from the second subsidiary module to the main module, wherein the test traffic is conveyed via the switch to the aid line connecting to the first subsidiary module; and reporting that a failure has occurred if the test traffic does not return to the second subsidiary module within a predetermined period of time.

2. A method according to claim 1, wherein instructing the first subsidiary module comprises configuring the first subsidiary module to loop back the traffic to the main module substantially without processing data comprised in the test traffic.

3. A method according to claim 2, wherein the first and second subsidiary modules are configured to transmit and receive data in different, respective first and second formats, and wherein the test traffic transmitted from the second subsidiary module and looped back by the first subsidiary module is in the second format.

4. A method according to claim 1, further comprising:

selecting one or more further idle lines for testing among the idle lines in the system, wherein the further idle lines connect to further ports of the switch on the main module; and repeating the configuring the switch, transmitting the test traffic, and reporting that the failure has occurred with respect to the further idle lines until all the idle lines have been tested.

5. A method according to claim 1, wherein the main module and said at least first and second subsidiary modules comprise cards, which are plugged into a backplane, and wherein the lines comprise traces on the backplane.

6. A method according to claim 1, wherein the switch is configured to connect the lines to a network communication trunk, and wherein the traffic comprises communication traffic.

7. A method according to claim 6, wherein transmitting the test traffic comprises testing the second idle line while continuing to use the lines that are not idle for carrying the data to the network communication trunk.

8. In an electronic system that includes a main module and multiple subsidiary modules, each of said multiple subsidiary modules being connected to the main module by one or more lines for carrying data, a method for self-testing the system, comprising:

selecting first and second subsidiary modules of different types for testing among the multiple subsidiary modules, the first and second subsidiary modules being configured to transmit and receive the data in different, respective first and second formats;

instructing the first subsidiary module to loop back traffic reaching the first subsidiary module from the main module;

configuring the main module to connect the first and second subsidiary modules, so that the traffic transmitted by the second subsidiary module is conveyed to the first subsidiary module via the main module and is then looped back via the main module to the second subsidiary module; and testing the system by causing the second subsidiary module to transmit test traffic in the second format to the main module, and assessing whether the test traffic is returned intact from the first module.

9. A method according to claim 8, wherein instructing the first subsidiary module comprises configuring the first subsidiary module to loop back the traffic to the main module substantially without processing data comprised in the test traffic.

10. A method according to claim 8, wherein the main module and subsidiary modules comprise cards, which are plugged into a backplane, and wherein the lines comprise traces on the backplane.

11. A method according to claim 8, wherein the main module comprises a switch, which is coupled to connect the lines to a network communication trunk, and wherein configuring the main module comprises configuring the switch to connect at least one of the lines of the first subsidiary module to at least one of the lines of the second subsidiary module.

12. A method according to claim 11, wherein testing the system comprises testing one or more of the lines of the second subsidiary module while continuing to use at least some of the lines that are not under test for carrying the data from the subsidiary modules to the network communication trunk.

13. A method according to claim 8, wherein the traffic comprises communication traffic, and wherein the first and second formats are determined respectively by different first and second communication protocols.

14. A method according to claim 13, wherein one of the first and second protocols is a time domain multiplexing (TDM) protocol, while the other of the first and second protocols is a packet data protocol.

15. Modular electronic apparatus, comprising:

a backplane, which comprises traces for carrying data between modules that are plugged into the backplane;

a main module, plugged into the backplane, the main module comprising a switch having ports for connection to the traces of the backplane;

at least first and second subsidiary modules, plugged into the backplane so as to be connected to the main module by the traces, at least some of which traces are sometimes idle; and a system control processor, which is operative to select a first idle trace among idle traces connecting the first subsidiary module to a first port of the switch on the main module to serve as an aid trace, to instruct the first subsidiary module to loop back traffic reaching the first subsidiary module via the aid trace, to select for testing a second idle trace among the idle traces connecting the second subsidiary module to a second port of the switch on the main module, and to configure the switch to link the first and second ports, the system control processor being further operative to cause test traffic to be transmitted over the second idle trace from the second subsidiary module to the main module, wherein the test traffic is conveyed via the switch to the aid trace connecting to the first subsidiary module, and to report that a failure has occurred if the test traffic does not return to the second subsidiary module within a predetermined period of time.

16. Apparatus according to claim 15, wherein the first subsidiary module is configured, under control of the system control processor, to loop back the traffic on the aid trace to the main module substantially without processing data comprised in the test traffic.

17. Apparatus according to claim 16, wherein the first and second subsidiary modules are configured to transmit and receive data in different, respective first and second formats, and wherein the test traffic transmitted from the second subsidiary module and looped back by the first subsidiary module is in the second format.

18. Apparatus according to claim 15, wherein the system control processor is operative to select one or more further idle traces for testing among the idle traces in the system, wherein the further idle traces connect to further ports of the switch on the main module, and to repeatedly configure the switch, cause the test traffic to be transmitted, and report the failure when it occurs with respect to the further idle traces until all the idle lines have been tested.

19. Apparatus according to claim 15, wherein the switch is configured to connect the traces to a network communication trunk, and wherein the traffic comprises communication traffic.

20. Apparatus according to claim 19, wherein the test traffic is transmitted over the second idle trace while continuing to use the trace that are not idle for carrying the data to the network communication trunk.

21. Modular electronic apparatus, comprising:
 a backplane, which comprises traces for carrying data between modules that are plugged into the backplane;
 a main module, plugged into the backplane;
 a plurality of subsidiary modules, plugged into the backplane so as to be connected to the main module by the traces; and
 a system control processor, which is operative to select first and second subsidiary modules of different types for testing among the multiple subsidiary modules, the first and second subsidiary modules being configured to transmit and receive the data in different, respective first and second formats, and which is further operative to test the modules by causing the first subsidiary module to loop back traffic reaching the first subsidiary module from the main module, by configuring the main module to connect the first and second subsidiary modules, so that a traffic transmitted by the second subsidiary module is conveyed to the first subsidiary module via the main module and is then looped back via the main module to the second subsidiary module, and by causing the second subsidiary module to transmit test traffic in the second format to the main module, and assessing whether the test traffic is returned intact from the first module.

22. Apparatus according to claim 21, wherein the first subsidiary module is configured to loop back the traffic to the main module substantially without processing the data comprised in the test traffic.

23. Apparatus according to claim 21, wherein the main module comprises a switch, which is coupled to connect the traces to a network communication trunk, and wherein the system control processor is operative to configure switch to connect at least one of the lines of the first subsidiary module to at least one of the lines of the second subsidiary module during the test.

24. Apparatus according to claim 23, wherein the system control processor is operative to test one or more of the traces connected to the second subsidiary module while at least some of the traces that are not under test continue to be used for carrying the data from the subsidiary modules to the network communication trunk.

25. Apparatus according to claim 21, wherein the traffic comprises communication traffic, and wherein the first and second formats are determined respectively by different first and second communication protocols.

26. Apparatus according to claim 25, wherein one of the first and second protocols is a time domain multiplexing (TDM) protocol, while the other of the first and second protocols is a packet data protocol.

* * * * *